United States Patent [19]

Fiorentzis

[11] 4,177,419
[45] Dec. 4, 1979

[54] TEST APPARATUS FOR CHECKING THE RESPONSE OF PROTECTIVE RELAYS

[75] Inventor: Michael Fiorentzis, Wettingen, Switzerland

[73] Assignee: BBC Brown Boveri & Company Ltd., Baden, Switzerland

[21] Appl. No.: 966,491

[22] Filed: Dec. 4, 1978

Related U.S. Application Data

[63] Continuation-in-part of Ser. No. 773,074, Feb. 28, 1977, abandoned.

[30] Foreign Application Priority Data

Mar. 15, 1976 [CH] Switzerland ............... 3164/76

[51] Int. Cl.² ............................................. G01R 31/02
[52] U.S. Cl. .................................. 324/418; 324/73 AT
[58] Field of Search .............. 324/28 R, 28 CB, 73 R, 324/73 AT

[56] References Cited

U.S. PATENT DOCUMENTS 3,678,372  7/1972  Elder ........................... 324/28 R

FOREIGN PATENT DOCUMENTS 2240734  2/1974  Fed. Rep. of Germany ........ 324/28 R

OTHER PUBLICATIONS

Austin, F. W.; Improved Portable Relay Test Set; Trans. & Distributions, vol. 26; No. 9; pp. 42-43; Sep. 1974.

Gore, W. M.; Relay Testing; Electrical Review; Feb. 22, 1946; pp. 293-295.

Primary Examiner—Robert J. Corcoran
Attorney, Agent, or Firm—Werner W. Kleeman

[57] ABSTRACT

A test apparatus for checking test objects, such as protective relays, especially voltage, current and/or frequency relays for the protection of a generator of a power supply network, comprising a first circuit for generating and converting test signals or magnitudes to be delivered to the test objects and a second circuit for pre-programming the test signals or magnitudes to be delivered to the test objects. The first circuit comprises a first test signal generating circuit for supplying the voltage relay and the current relay with voltage and current test signals, respectively, and contains a first secondary winding of a test transformer. A static potentiometer is connected in parallel with this first secondary winding. The potentiometer supplies test signals in finely stepped or graduated values to the test objects. The first circuit further comprises a second test signal generating circuit for supplying the frequency relay with frequency test magnitudes. The second circuit embodies a test matrix composed of intersecting electrically conductive rails. The test matrix stores information concerning the test signals to be delivered to the relays. A signal and control device operatively connected with the test matrix and receiving therefrom the stored information concerning the test signals stores a predetermined course of the test program and correspondingly controls the performance of the test.

8 Claims, 1 Drawing Figure

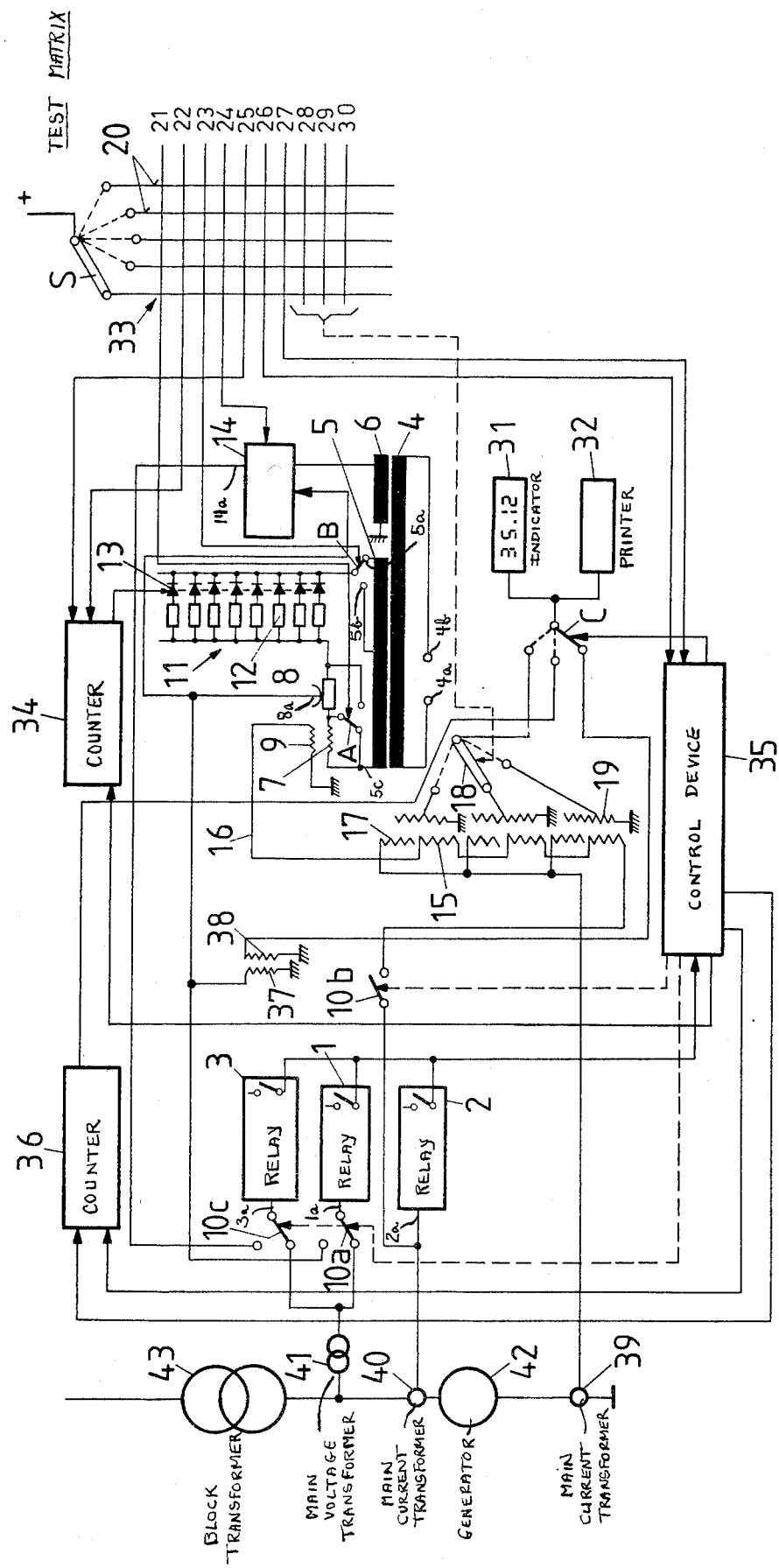

TEST APPARATUS FOR CHECKING THE RESPONSE OF PROTECTIVE RELAYS

CROSS-REFERENCE TO RELATED CASE

This application is a continuation-in-part of my commonly assigned, copending United States application Ser. No. 773,074, filed Feb. 28, 1977 now abandoned.

BACKGROUND OF THE INVENTION

The present invention relates to a new and improved test apparatus for the checking of test objects, typically protective relays, especially voltage, current and/or frequency relays for protecting generators of a power supply network.

This test apparatus comprises a first circuit for generating and transforming test signals or magnitudes which are to be delivered to the test object, a second circuit for pre-programming the test signals or magnitudes which are to be delivered to the test objects, a signal and control device for controlling the course of the test, and a measuring device for measuring the relay response values.

Test devices of the previously mentioned type, wherein for testing a relay the test signal or magnitude is supplied to the primary side of the relay and the test is designated as a so-called "primary checking" or "primary test", have been known for quite some time. However, these devices possess the drawbacks that complicated equipment is needed for producing the test signals or magnitudes, which may be for instance variable voltages, currents or frequencies, to be delivered to the test objects. With numerous protective devices taught to the art by the assignee of this application, potentiometers having movable parts are employed for producing variable test voltages. These potentiometers are prone to disturbance during operation and are complicated to control. In order to test frequency relays there are provided complicated means for measuring the relay frequency. Further, the heretofore known test devices are collectively complicated and expensive.

SUMMARY OF THE INVENTION

Hence, with the foregoing in mind it is a primary object of the present invention to provide a new and improved construction of test apparatus for the checking or testing of protective relays in a manner not associated with the aforementioned drawbacks and limitations of the prior art proposals.

Another and more specific object of the present invention aims at the provision of a test apparatus of the previously mentioned type wherein it is possible to produce the test signals or magnitudes, whether such be voltages, currents or frequencies, with the aid of relatively simple means in an economical manner, and which is suitable for the manual or automatic testing of both simple as well as complicated protective devices.

Now in order to implement these and still further objects of the invention, which will become more readily apparent as the description proceeds, the test apparatus of the present invention is manifested by the features that the first circuit contains a first test signal generating circuit for supplying the voltage relay and current relay with voltage and current test signals or magnitudes, respectively, which appear at the secondary winding of a test transformer with which there is connected in parallel a static potentiometer. This static potentiometer comprises a combination of resistors and electronic switches and delivers to the test objects test signals or magnitudes in finely stepped values. The first circuit further comprises a second test signal generating circuit for supplying the frequency relay with frequency test magnitudes.

The second circuit comprises a test matrix. The signal and control device operatively connected with the test matrix and receiving therefrom the information relating to the test signals or magnitudes stores a predetermined course of a test program and correspondingly controls the test course.

The test apparatus of the invention possesses the following advantages:

In order to deliver the test signals or magnitudes to the different test objects there is used a potentiometer which does not possess any movable parts, thus is not prone to disturbances and can be controlled more easily. The test signals or magnitudes—voltage, current or frequency—are delivered to the test object while approximately continuously increasing or decreasing in steps or increments and upon reaching the relay response value are displayed and printed-out. A large number of different protective relays, such as voltage, current and/or frequency relays, can be checked in succession in this manner as concerns their response value and their response time. The decision, whether the realized values are correct or incorrect, is left to the person examining the test report or results.

BRIEF DESCRIPTION OF THE DRAWING

The invention will be better understood and objects other than those set forth above, will become apparent when consideration is given to the following detailed description thereof. Such description makes reference to the annexed drawing wherein the single FIGURE illustrates a circuit diagram of an apparatus for the checking of protective devices, typically protective relays.

DETAILED DESCRIPTION OF THE PREFERRED EMBODIMENTS

Describing now the drawing, the single FIGURE illustrates by way of example circuitry of an automatic test apparatus for the checking of test objects, here in the form of protective relays 1, 2 and 3, shown by way of example in the environment of a protective device for a generator of a power supply network. During operation, the network currents flow through the protective relays and such have applied thereto the network or operating voltages delivered by the power plant. Such a power plant has been schematically indicated in the drawing by the generator 42, the block transformer 43, the main current transformers or converters 39 and 40 and the main voltage transformer or converter 41. For the sake of simplicity there have only been shown three relays, a voltage relay 1, a current relay 2 and a frequency relay 3. However, in practice the number of relays which must be checked is usually considerably greater. During the testing or checking operation, the relays are supplied in a predetermined sequence with their appropriate test signals or magnitudes and their response behaviour is measured, indicated and recorded.

A first circuit is provided for generating and converting the test signals or magnitudes which are to be delivered to the test object, i.e., the relays. This first circuit comprises a test transformer 4, 5, 6 having a primary winding 4 connected with an alternating-current voltage source, schematically represented by the supply terminals 4a and 4b, and two secondary windings 5 and 6. The first circuit also encompasses a first test signal generating circuit 5, 11, 8, 37, 38, 7, 9 for supplying the voltage relay 1 and current relay 2 with voltage test signals and current test signals, respectively, and a second test signal generating circuit 5, 11, 14 for supplying the frequency relay 3 with frequency test signals or magnitudes.

The first test signal generating circuit comprises the first secondary winding 5 of the test transformer 4, 5, 6 and a so-called static potentiometer 11 connected in parallel with the secondary winding 5. This potentiometer 11 consists of a parallel combination of series circuits, each of which is composed of a resistor 12 and series connected electronic switch 13, typically by way of example a triac. The resistors 12 and dual stepped and can be selectively and in combination connected and disconnected by means of the electronic switches 13, so that there can be adjusted finally stepped resistance values. The static potentiometer 11 can be connected, on the one hand, by means of a switch B with one terminal or output 5a of the secondary winding 5 with a tap 5b of this secondary winding and, on the other hand, by means of a fixed resistor, i.e., a potentiometer 8 and by means of the primary winding 7 of a current transformer 7, 9 with the other terminal or output 5c of such secondary winding 5. The tap 8a of the potentiometer 8 is connected by means of switch 10a with the primary side input 1a of the voltage relay 1 and by means of the primary winding 37 of a voltage-measuring transformer 37, 38 with ground potential. The secondary winding 38 of this voltage-measuring transformer 37, 38 is connected with ground potential and by means of a switch C with a display device 31 and a small printer 32. The secondary winding 9 of the current transformer 7, 9 is connected with ground potential and by means of the partial windings 15 of the primary winding of a phase compensation device 15, 17, 18, 19 and by means of a switch 10b with the primary side-input 2a of the current relay 2. The not particularly referenced output of the potentiometer 8, connected with the primary winding 7 of the current transformer 7, 9, is electrically connected with a rest contact of a switch A. In the illustrated position of this switch A this primary winding 7 is short-circuited in order to perform a voltage test. In its other position the switch A short-circuits or shunts the potentiometer 8 during the performance of a current test. The potentiometer 11 has assigned to it the task of varying, as required, the magnitude of the test voltage and the test current, as the case may be. The test signals which are delivered to the relays therefore can be changed so as to constitute magnitudes which either increase or decrease.

The second test signal generating circuit 5, 11, 14 consists of the secondary winding 5 of the test transformer 4, 5, 6, the potentiometer 11 and the voltage-frequency converter 14 connected in circuit therewith. The output 14a of the voltage-frequency converter 14 leads, by means of a switch 10c, to the primary side input 3a of the frequency relay 3. The voltage which is adjusted by means of the potentiometer 11 is converted by the voltage-frequency converter 14 into a frequency signal which is delivered to the frequency relay 3. This test signal, prior to its conversion into a frequency signal, is measured by means of the voltage-measuring transformer 37, 38 as a voltage, so that there is not required any direct frequency measurement. The secondary winding 6 of the test transformer 4, 5, 6 serves to power the voltage-frequency converter 14.

The second circuit for pre-programming the test signals or magnitudes, which are delivered to the test objects, will be seen to comprise a test matrix 33 having five vertical rails 20 and ten horizontal rails 21 to 30 which intersect at the grid points. These vertical rails 20 and horizontal rails 21 to 30 are arranged in a matrix array.

During testing of the relays the vertical rails 20 receive in succession, for instance by means of a selector switch S, a voltage signal which is further transmitted by means of not particularly shown plug-in diodes to the horizontal rails. Each of these rails 20 is operatively correlated to a relay model or a relay type which is to be tested, i.e., it is possible by means of such selector switch S and by means of such rails 20 to successively control for testing purposes a number of relays of the same type or also different types of relays. The number of vertical rails 20 is dependent upon the number of relays which are to be tested within a measuring cycle. The programming of the rail arrangement or test matrix 33 and the correlation of the control functions in accordance with the relay type which is to be tested in each instance, is accomplished by the aforementioned, not particularly illustrated plug-in diodes which, in each case, connect a vertical rail at the grid or intersection locations, in accordance with the intended purpose, with a horizontal rail. Each horizontal rail constitutes a control output of the second circuit and is associated in each case with a test signal or control function within the test operation. Thus, for instance, the rail 21 serves for selectively testing current or voltage, the rail 22 for testing minimum or undercurrent values, the rail 23 for switching to a second sensitivity range, the rail 24 for frequency testing, the rail 25 for testing current relays having inverse characteristics, the rail 26 for testing the second response stage of the relays, the rail 27 for jumping relay which is not to be tested. The rails 28, 29 and 30 serve to control a reversing switch 18 for the selection of the phases R, S, T of the phase compensation device 15, 17, 18, 19 which will be described more fully hereinafter.

If, accordingly, the rail 21 for a voltage test is activated by means of a plugged-in diode i.e. carries a voltage signal, then the switch A is brought into the illustrated position where the primary winding 7 of the current transformer 7, 9 is short-circuited. To carry out a current test the switch A is brought into its other position in which it short-circuits the resistor 8. A control signal from the rail 23 controls the switch B by means of which the potentiometer 11 is connected with the secondary winding 5 of the test transformer 4, 5, 6. When the rail 23 carries a potential, then the potentiometer 11 is connected with the tap of such secondary winding 5.

Control signals from the rails 22 and 25 control a first counter 34, which, in turn, controls the static potentiometer 11. A signal from the rail 24 controls the voltage-frequency converter 14 in that it blocks or activates the same. The rails 26 and 27 are connected with a control device 35 which thus receives information from the test matrix 33 concerning the test signals to be supplied. Additionally, the control device 35 stores a predetermined test program course and controls the course or progress of the test in accordance with such program. For this purpose the control device 35 is connected in circuit with the test objects i.e., the relays 1, 2 and 3 and is controllably connected with the test contacts 10a, 10b and 10c of these relays 1, 2, and 3.

The counter 34 which is connected with the static potentiometer 11 opens and closes, respectively, in a suitable sequence the eight triacs 13 of the dual stepped static potentiometer 11, so that the total current flowing through the parallel circuit of the eight triacs 13 increases in 256 stages from null to its maximum value or decreases from its maximum value to null. The static potentiometer 11 is controlled by the counter 34 in a manner such that it delivers in an approximately continuously increasing or decreasing fashion to the relevant relay which is undergoing the test, the test signals, voltage, current or frequency. The related relay, at the moment that it responds, blocks the counter 34 at a count corresponding to the relay response value. A second counter 36, which is operatively connected with the control device 35 and receives therefrom start and stop signals, counts the response time of the relay which is undergoing the test. The relay which is in the progress of being tested blocks the counter 36, at the count corresponding to the response time, by means of a stop signal from the control device 35. A display device 31 which is operatively connected by means of a switch C with the counter 36 and with the voltage-measuring transformer 37, 38 provides a read-out or visual display and the small printer 32 the automatic print-out of the response time and the response value, respectively, in succession.

The measurement of the test voltages and the measurement of the test currents constitute two different problems. During the testing of voltage relays and frequency relays the network voltage is turned-off during the test operation, so that there are effective at these relays the test voltage or the test frequency, as the case may be. Both of these test signals are measured in the form of voltages by means of the voltage transformer 37, 38 and the digital display device 31.

On the other hand, testing of the current relay 2 is carried out during operation without interrupting the flow of the network currents, so that this relay has flowing therethrough a mixture of the network and test currents. However, what is measured is not the test current itself, rather the sum of the network current and the test current. Phase differences between these currents are compensated in the phase compensation device 15, 17, 18 and 19. This compensation device comprises first primary windings 15 through which flows the test current intended for the current relay 2 and delivered by the current transformer 7, 9, second primary windings 17 through which flows the network current delivered by the main current transformer 39 of the power plant, and secondary windings 19 through which flows the phase-compensated test current. The reversing switch 18 controlled by the rails 28, 29, 30 of the test matrix 33 and operatively connected with the indicator device 31 and the small printer 32, selects the appropriate one of the phase R,S,T and delivers the phase-compensated test current to the indicator device 31 and the small printer 32. In accordance with the test program, the switch C is controlled by the control device 35.

While there are shown and described present preferred embodiments of the invention, it is to be distinctly understood that the invention is not limited thereto, but may be otherwise variously embodied and practiced within the scope of the following claims.

What I claim is:

1. A test apparatus for checking of test objects, typically protective relays, especially voltage, current and frequency relays for protecting a generator of a power supply network, comprising:

a first circuit for producing and transforming the test magnitudes which are to be delivered to the test objects;

a second circuit for pre-programming the test magnitudes which are to be delivered to the test objects;

a signal and control device for controlling the course of the test;

a measuring device for measuring relay-response values;

said first circuit comprising a first test signal generating circuit for supplying a voltage relay and current relay with voltage test magnitudes and current test magnitudes, respectively;

said first test signal generating circuit comprising a test transformer having a secondary winding and a primary winding;

said first test signal generating circuit further comprising a static potentiometer connected in parallel with the secondary winding;

said static potentiometer comprising a combination of resistors and electronic switches connected in circuit with one another for delivering test magnitudes to the test objects in finely graduated values;

means for controlling said static potentiometer;

said first circuit further containing a second test signal generating circuit for supplying a frequency relay with frequency test magnitudes;

said second circuit for pre-programming the test magnitudes containing a test matrix for supplying information concerning the test magnitudes; and said signal and control device being operatively connected with said test matrix and receiving said information therefrom and storing a predetermined test course-program and controlling the test course in accordance with said program.

2. The test apparatus as defined in claim 1, wherein:

said means for controlling said static potentiometer comprises a first counter operatively connected with said static potentiometer;

said first counter controlling said static potentiometer such that said static potentiometer delivers the test magnitudes to the relay which is to be checked so as to approximately continuously increase or decrease;

said relay to be checked, at the moment of its reponse, blocking said counter at a count corresponding to the response value of said relay.

3. The test apparatus as defined in claim 2, wherein:

said measuring device including means incorporating a digital indicator device and a printer for respectively indicating and printing any one of the response time, the response value, or both, of the checked relay;

said means of said measuring device comprises a voltage-measuring transformer;

said voltage-measuring transformer including a primary winding which receives the test voltage;

said voltage-measuring transformer further including a secondary winding operatively connected with at least any one of said digital indicator device and said printer.

4. The test apparatus as defined in claim 1, wherein:

said measuring device includes a counter operatively connected by means of said control device with the relay which is to be checked and counting the response time of said relay.

5. The test apparatus as defined in claim 4, wherein:
said measuring device further includes a digital indicator device and a printer for respectively indicating and printing at least any one of the response time, the response value, or both, of the checked relay.

6. The test apparatus as defined in claim 5, wherein:
said measuring device comprises a voltage-measuring transformer;
said voltage-measuring transformer including a primary winding which receives the test voltage;
said voltage-measuring transformer further including a secondary winding which is operatively connected with at least any one of said digital indicator device and said printer.

7. The test apparatus as defined in claim 1, further including:
a main current transformer;
said first test signal generating circuit comprises a current transformer;
said measuring device comprises a compensation device for compensating the phase differences existing between the network currents and the test currents during checking of the current relay which is carried out during operation of the generator;
said compensation device comprising first primary windings through which flows the test current intended for the current relay to be checked and delivered by the current transformer of the first test signal generating circuit;
said compensation device further including second primary windings through which flows the network current delivered by the main current transformer;
said compensation device still further comprising secondary windings at which appears the phase-compensated test current.

8. The test apparatus as defined in claim 7, wherein:
said measuring device comprises means including an indicator device for indicating at least any one of the response time and the response value of the relay to be checked;
said test matrix comprising a predetermined arrangement of signal carrying-conductive rails intersecting at grid points and serving for initiating desired checking operations;
switching means cooperating with said secondary windings of said compensation device and controlled by given ones of said signal carrying-conductive rails of said test matrix for current phase-selection;
said switching means being operatively connected with said indicator device.

* * * * *